(12) United States Patent
Sunter

(10) Patent No.: US 7,159,159 B2
(45) Date of Patent: Jan. 2, 2007

(54) CIRCUIT AND METHOD FOR ADDING PARAMETRIC TEST CAPABILITY TO DIGITAL BOUNDARY SCAN

(75) Inventor: Stephen K. Sunter, Nepean (CA)

(73) Assignee: LogicVision, Inc., San Jose, CA (US)

( * ) Notice: Subject to any disclaimer, the term of this patent is extended or adjusted under 35 U.S.C. 154(b) by 544 days.

(21) Appl. No.: 10/414,309

(22) Filed: Apr. 16, 2003

(65) Prior Publication Data

US 2003/0208708 A1   Nov. 6, 2003

Related U.S. Application Data

(60) Provisional application No. 60/376,557, filed on May 1, 2002.

(51) Int. Cl.
*G01R 31/28* (2006.01)

(52) U.S. Cl. .................................. 714/724; 714/734

(58) Field of Classification Search ................ None
See application file for complete search history.

(56) References Cited

U.S. PATENT DOCUMENTS

| | | | |
|---|---|---|---|
| 4,625,310 A | * | 11/1986 | Mercer ..................... 714/724 |
| 5,220,281 A | | 6/1993 | Matsuki, Koji |
| 5,225,834 A | * | 7/1993 | Imai et al. ................. 341/120 |
| 5,404,358 A | | 4/1995 | Russell |
| 5,477,493 A | | 12/1995 | Danbayashi |
| 5,744,949 A | | 4/1998 | Whetsel |
| 6,104,198 A | | 8/2000 | Brooks |
| 6,199,182 B1 | | 3/2001 | Whetsel |
| 6,262,585 B1 | | 7/2001 | Frodsham et al. |
| 6,327,122 B1 | | 12/2001 | Pinarbasi |
| 6,446,230 B1 | | 9/2002 | Chung |
| 6,499,124 B1 | | 12/2002 | Jacobson |
| 2002/0120895 A1 | | 8/2002 | Suzuki |

OTHER PUBLICATIONS

Lofstrom, Keith, "A Demonstration IC for the P1149.4 Mixed Signal Test Standard", 1996 ITC Proceedings.
Parker et. al., "Design, Fabrications and Use of Mixed-Signal IC Testability Structures", 1997 ITC Proceedings.

* cited by examiner

*Primary Examiner*—Christine T. Tu
(74) *Attorney, Agent, or Firm*—Eugene E. Prouix

(57) ABSTRACT

A boundary scan cell for use in a circuit having a boundary scan shift register (BSSR) having boundary scan cells associated with pins of the circuit, the cell having a single-bit shift register element and an associated update latch, comprises a logic circuit for controlling the logic state of an associated pin, analog switches connecting the associated pin to analog test buses, and logic circuitry for selectively configuring the cell in a parametric test mode in which the cell shift register element controls the analog switches, and in a digital test mode in which the cell shift register element controls the logic state of the associated pin.

19 Claims, 18 Drawing Sheets

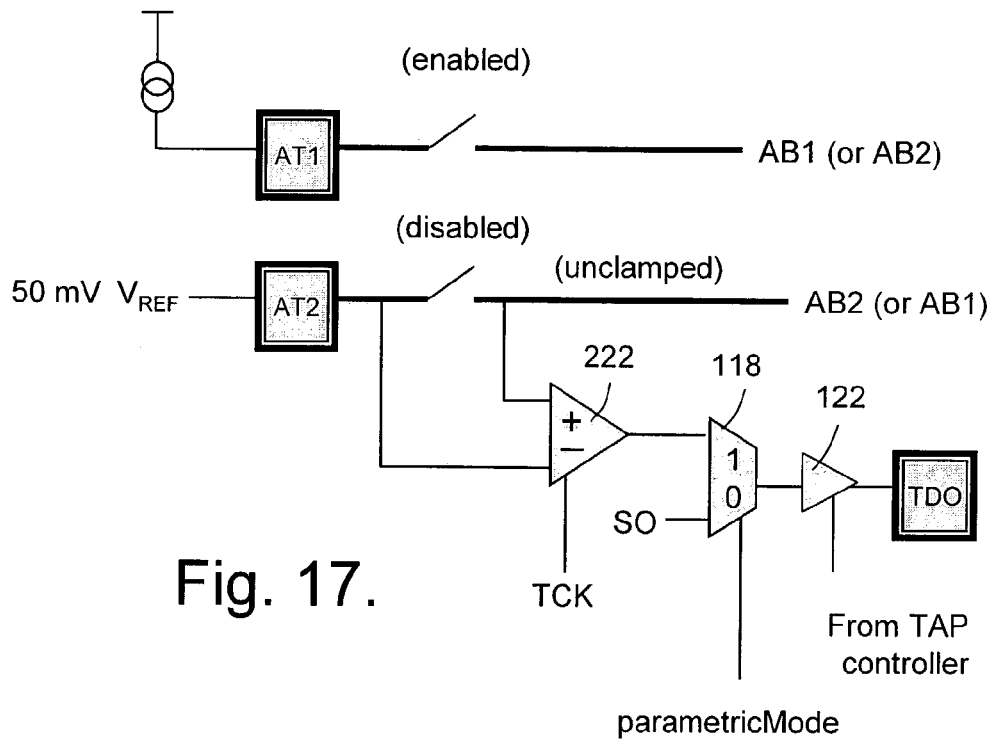
Fig. 17.
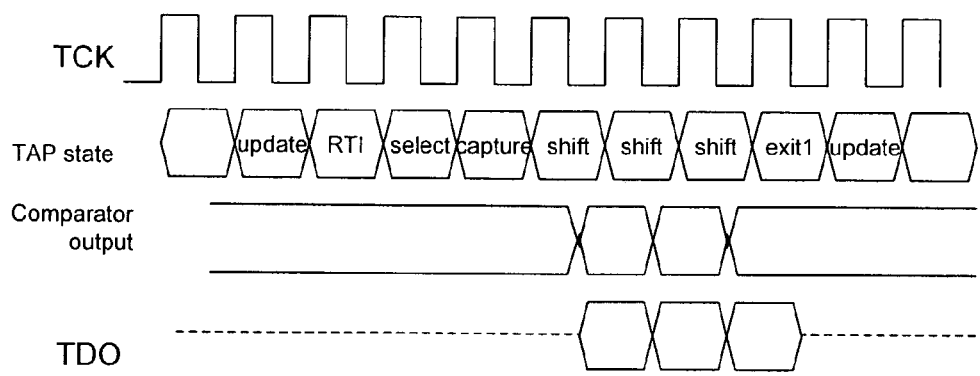

CIRCUIT AND METHOD FOR ADDING PARAMETRIC TEST CAPABILITY TO DIGITAL BOUNDARY SCAN

CROSS-REFERENCE TO RELATED APPLICATIONS

This application claims the benefit of U.S. Provisional Patent Application Ser. No. 60/376,557 filed May 1, 2002.

BACKGROUND OF THE INVENTION

1. Field of the Invention

The present invention generally relates to the testing of integrated circuits (ICs) and circuit boards, or substrates, on which ICs are mounted and, more specifically, to a logic circuit for a circuit boundary scan cell and a method for performing parametric tests on a circuit having digital and analog pins.

2. Description of Related Art

As printed circuit boards populated with ICs get smaller and more dense, it becomes more difficult to quickly diagnose and repair the boards. As a result, digital boundary scan is becoming a popular design for test (DFT) technique to permit quick verification of board-level connections between ICs. Further, as the pin-count of new ICs increases each year, and the cost of high pin-count testers increases, it becomes necessary to consider reduced pin count testing where only a small subset of an IC's pins are contacted during an IC test. The un-contacted pins are then tested via boundary scan circuitry that controls every pin.

The preferred way, in industry, to implement digital boundary scan is according to the rules defined in the "IEEE Standard Test Access Port and Boundary-Scan Architecture", published in 1990 and 2001, by the Institute for Electrical and Electronic Engineers (IEEE), which is also known as IEEE Std. 1149.1-2001, or simply 1149.1. This standard requires a minimum of one shift register bit per IC pin, and shifts boundary scan data in to a boundary scan register via a pin denoted TDI and out through a pin denoted TDO, as shown in FIG. 1. FIG. 1 shows a circuit 10 having digital circuitry 12 and digital pins 14. The shift register bits are implemented by means of boundary scan cells 16. A boundary scan cell for an individual digital pin is shown in FIG. 2. Boundary scan cell 16 includes a shift register element 18 whose output is connected to an update latch 20 and to a cell test data output TDO. A cell output multiplexer 22 receives a functional input, shown as "From core", and the output of update latch 20 and a mode control signal, shown as selectJtagOut, and provides an output to pad 24 via pin driver 26. A cell input multiplexer 28 receives the output of mux 22 and a test data input TDI and a control input shown as ShiftEnable. A Test Access Port (TAP) controller 30 is provided to facilitate digital boundary scan testing. FIG. 1A is a state diagram for TAP controller 30.

A digital boundary scan test comprises enabling a serial shift register that accesses the pins of an IC, shifting in logic values to each output pin, updating the logic value at each output pin with the value shifted in, parallel capturing the logic values received at each input pin, and serially shifting out the captured values for examination by a tester.

Another standard entitled "IEEE Standard for a Mixed Signal Test Bus", was published in 1999 by the IEEE, and is known as IEEE Std. 1149.4-1999, or simply 1149.4. The general architecture of an IC designed according to 1149.4 is shown in FIG. 3. FIG. 3 is similar to FIG. 1 except for the addition of analog circuitry 32 and a Test Bus Interface (TBIC) Circuit 34 which connects and controls internal buses AB1 and AB2 to external buses via pins AT1 and AT2 and analog boundary modules (ABM) 36 associated with analog pins 38. 1149.4 defines an analog bus that connects, within each IC, to the pins of the IC and permits an analog stimulus current to be conveyed to each pin on a bus, AB1, and the analog response voltage to be conveyed from each pin on another bus, AB2, as shown in FIG. 4. Electrical connection of each pin to each analog bus wire is enabled by two dedicated logic bits, denoted B1 and B2, of a boundary scan shift register (BSSR), according to 1149.4, and each on-chip analog bus wire is also connected via the test bus interface circuit (TBIC) to an off-chip analog bus pin, AT1 or AT2, of the IC. This permits a stimulus signal to be supplied from a signal source external to the ICs and the response voltage to be measured by equipment external to the ICs. The digital state of each pin is also controlled by two dedicated bits, denoted D and C in FIG. 4, of the BSSR, according to 1149.4, for a total of four BSSR bits per pin.

The capabilities of this 1149.4 test bus have been described in several published papers, including, "Design, Fabrication, and Use of Mixed-Signal IC Testability Structures" by K. Parker et al, published in the Proceedings of the 1997 ITC (Nov. 1–6, 1997). This test bus was primarily designed to permit the measurement of discrete passive components, including capacitors and resistors, that are connected to the pins of ICs and that might otherwise be inaccessible due to the density of the circuit boards containing these ICs and components. It is possible to apply a stimulus to a pin, via one of these test buses, and to simultaneously monitor the pin's response voltage via another of these test buses, and to thus determine the impedance of a circuit that has been connected to the pin. The boundary scan cell for an individual analog pin is shown in FIG. 4. Almost identical circuitry is used for a digital pin if analog access to the pin is desired. It will be seen that an 1149.4 test cell requires many more gates than an 1149.1 test cell.

A paper entitled, "A Demonstration IC for the P1149.4 Mixed-Signal Test Standard" by K. Lofstrom and published in the 1996 ITC Proceedings (Oct. 20–25, 1996) discloses a technique denoted as "Early Capture" for comparing a pin voltage to a reference voltage that is supplied via one of the 1149.4 on-chip analog buses, and the digital comparison result is shifted out via the boundary scan register and TDO. A comparator is connected to the data scan register bit associated with each pin's signal.

Frodsham et al U.S. Pat. No. 6,262,585 granted on Jul. 17, 2001 for "Apparatus for I/O Leakage Self-test in an Integrated Circuit", discloses circuitry which is the same as that prescribed by 1149.4, except that some elements have been removed, such as the second analog bus access to the pad. A boundary scan register bit at each pin enables an analog switch that connects an analog current stimulus bus to the pin. A comparator compares the voltage at the pin and an externally-supplied voltage threshold to determine if the leakage current through the pin is excessive.

Russell et al. U.S. Pat. No. 5,404,358 granted on Apr. 4, 1995 for "Boundary Scan Architecture Analog Extension" discloses a method and apparatus which provide an analog mode of operation of a standard test access bus interface based on a standard Boundary Scan architecture. Circuits are included in the interface which enable a sharing of data paths at separate time intervals defined under instruction control for processing analog and digital signals thereby providing a hybrid capability without any increase in the number of lines required by the interface.

Whetsel U.S. Pat. No. 5,744,949 granted on Apr. 28, 1998 for "Analog Test Cell Circuit" discloses analog test cells that permit testing analog circuitry.

Applicant's U.S. patent application Ser. No. 09/768,501 filed on Jan. 25, 2001 for "Method for Scan Controlled Sequential Sampling of Analog Circuits and Circuit for Use Therewith", incorporated herein by reference, discloses the 1149.4 boundary scan cell to permit "partial updating"—updating only the latches that control the analog switches connecting each pin to the analog buses. This circuit requires a third mode signal to control whether full or partial update occurs.

A proposed standard for boundary scan testing of AC coupled differential signals, denoted as IEEE P1149.6 proposes comparing AC-coupled digital input signals to a reference voltage using a hysteretic comparator connected to each pin of a differential pair, and capturing the output of the comparator by the pin's boundary scan register bit, and then shifting out captured values via the boundary scan register. A hysteretic comparator is a comparator with hysteresis—its apparent input switching point is decreased slightly if the previous input voltage was higher than the reference voltage, and it is increased slightly if the previous input voltage was lower than the reference voltage.

A drawback of existing circuits is that a designer who wishes to provide analog access to digital IC pins that are controlled by 1149.1 boundary scan, is compelled to use the 1149.4 boundary scan cells of FIG. 4, and accept the accompanying gate count penalty, in order to use conventional 1149.1 and 1149.4 software and hardware tools for performing boundary scan testing.

SUMMARY OF THE INVENTION

The present invention seeks to add analog access facilities to the 1149.1 boundary scan circuitry for digital pins using substantially fewer logic gates at each pin than required by 1149.4, and doing so in a manner which is compliant with 1149.1 and 1149.4 rules.

The present invention also seeks to provide test circuitry which will permit sequential analog access to the digital and analog pins without requiring reloading of the boundary scan chain, and the digital result of a sequential comparison between each pin's voltage and a reference voltage be output via the TDO pin so that commonly available 1149.1-based board test equipment can monitor the comparison results.

One aspect of the present invention is generally defined as a boundary scan cell for use in a circuit having a boundary scan shift register (BSSR) having boundary scan cells associated with pins of the circuit, the cell having a single-bit shift register element and an associated update latch, the boundary scan cell comprising: a logic circuit for controlling the logic state of an associated pin; analog switches connecting the associated pin to analog test buses; and logic circuitry, responsive to a cell mode signal, for selectively configuring the cell in a parametric test mode in which the cell shift register element controls the analog switches, and in a digital test mode in which the cell shift register element controls the logic state of the associated pin.

As will be seen, in a preferred embodiment of the present invention, the circuit comprises 1149.1 boundary scan that is modified to facilitate analog access to each IC pin via the on-chip AB1 and AB2 test buses stipulated by 1149.4. The inputs of a comparator may be connected to an on-chip analog bus, AB1 or AB2, and the off-chip bus, AT1 or AT2, and the output of the comparator connected to the test data output, TDO to allow conventional 1149.1-based software and hardware to perform parametric tests by simply supplying a DC reference voltage to AT1 or AT2.

Another aspect of the present invention is generally defined as a method of preforming parametric tests on a circuit having a boundary scan shift register (BSSR) having boundary scan cells associated with each circuit pin and each boundary scan cell being configurable into a test mode in which the BSSR controls the logic state of the pin and a parametric test mode in which the BSSR controls analog switches connecting the associated circuit pin to analog test buses, the method comprising: configuring the boundary scan cells in a test mode in which the logic state of the pins is controlled by the content of its associated cell shift register element; loading logic 0's and 1's into the BSSR to set the logic state of the circuit pins; configuring the boundary scan cells in a parametric test mode in which the state of the analog switches is controlled by the content of its associated cell shift register element; loading logic 0's and a single logic 1 into the BSSR; and shifting the contents of the BSSR while monitoring circuit test data output bits resulting from a comparison of a signal on one of the analog test buses with a reference voltage on another of the analog buses.

BRIEF DESCRIPTION OF THE DRAWINGS

These and other features of the invention will become more apparent from the following description in which reference is made to the appended drawings in which:

FIG. 17 is a schematic similar to FIG. 10, except that the comparator is strobed by TCK, and is not re-timed before delivery to TDO, in accordance with an embodiment of the present invention.

DETAILED DESCRIPTION OF EMBODIMENTS OF THE INVENTION

In the following detailed description, numerous specific details are set forth in order to provide a thorough understanding of the present invention. However, it will be understood by those skilled in the art that the present invention may be practiced without these specific details. In other instances, well known methods, procedures, components and circuits have not been described in detail so as not to obscure aspects of the present invention.

A primary objective of the invention is to facilitate analog access to digital IC pins that are controlled by 1149.1 boundary scan cells in a way that is compliant with 1149.4 but that uses fewer logic gates than 1149.4 requires for analog pins.

Figure 4:
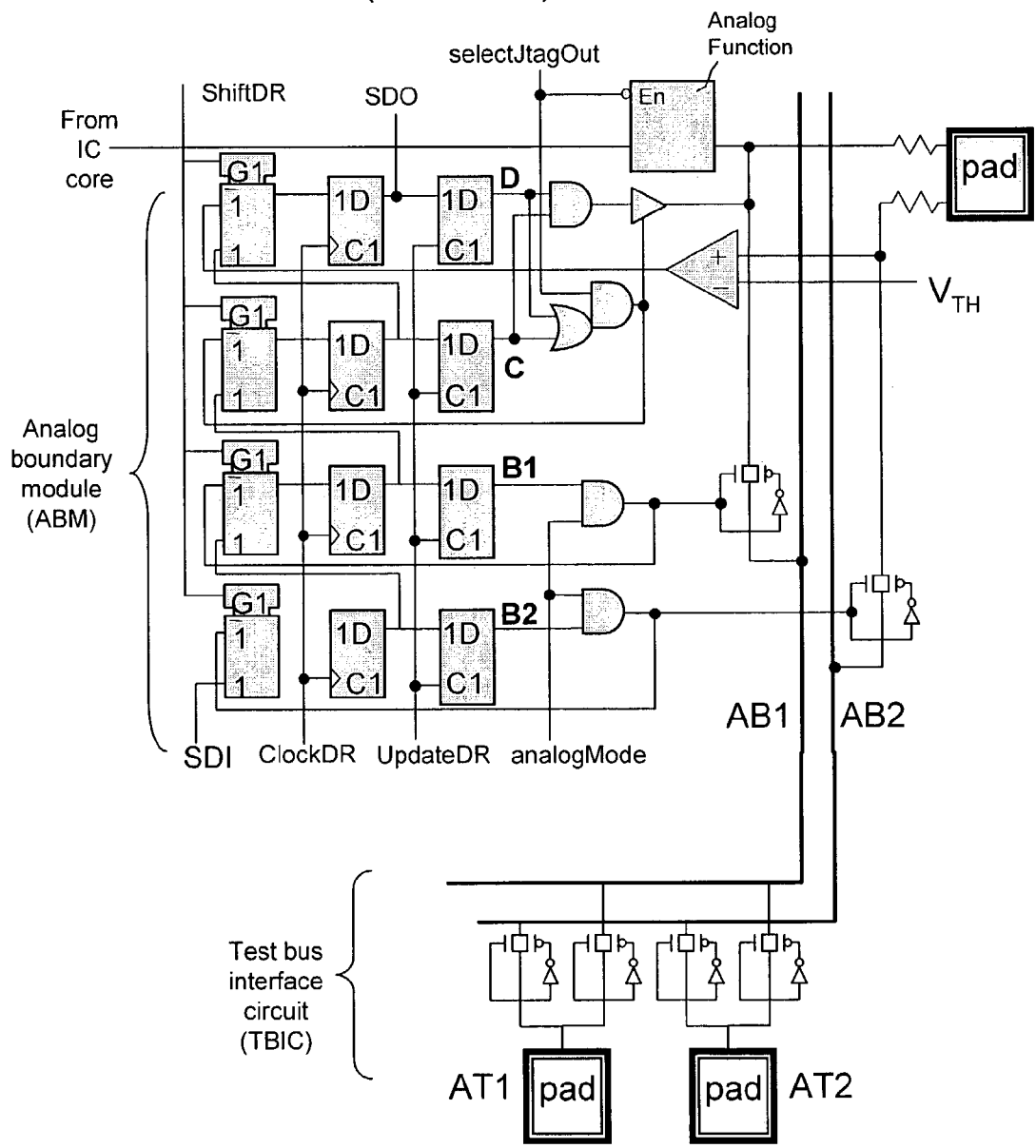
FIG. 4 is a prior art schematic of a typical 1149.4 boundary module.

As previously mentioned, 1149.4 defines an analog bus that connects within each IC to the pins of the IC and permits an analog stimulus current to be conveyed to each pin on a bus, AB1, and the analog response voltage to be conveyed from each pin on another bus, AB2, as shown in FIG. 4. Electrical connection of each pin to each analog bus wire is enabled by two dedicated logic bits (denoted B1 and B2) of a boundary scan shift register (BSSR), according to 1149.4, and each on-chip analog bus wire is also connected via a test bus interface circuit (TBIC) to an off-chip analog bus pin, AT1 or AT2, of the IC so that the stimulus signal can be supplied from a signal source external to the ICs and a response voltage can be measured by equipment external to the ICs. The digital state of each pin is also controlled by two dedicated bits (denoted D and C) of the BSSR, according to 1149.4, for a total of four BSSR bits per pin.

However, according to 1149.1, for a group of tristate digital pins (without analog bus access) that are enabled by a single Enable signal, only one BSSR bit is needed per pin, plus one BSSR bit for the common Enable. In other words, one BSSR bit per pin is the minimum number of gates that an 1149.1-compliant implementation requires. Therefore, this is our reference against which the number of gates will be compared. The present invention seeks to add the minimum number of gates beyond that to provide analog access to digital pins.

Figure 3:
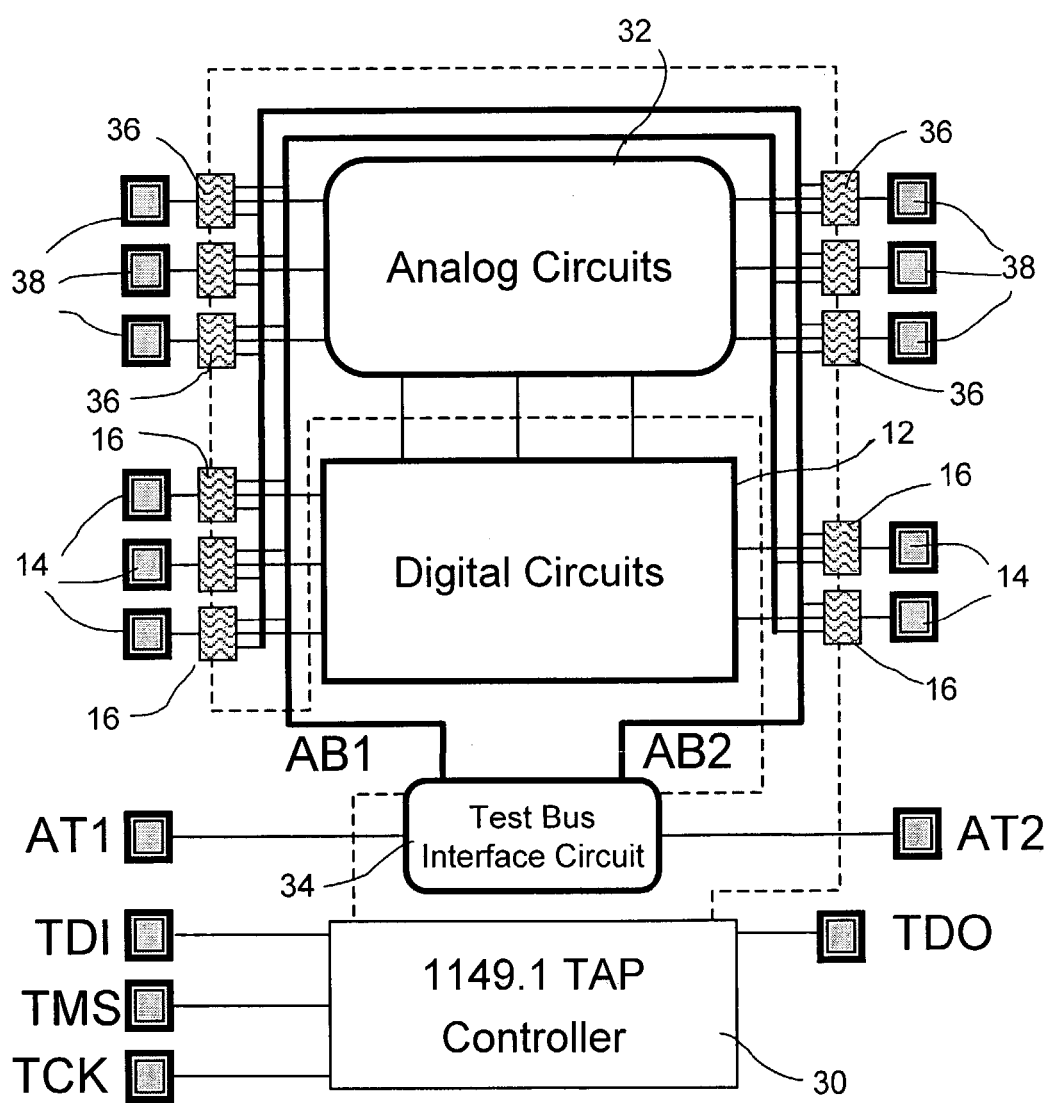
FIG. 3 is prior art architecture of 1149.4-compliant IC.
Figure 5:
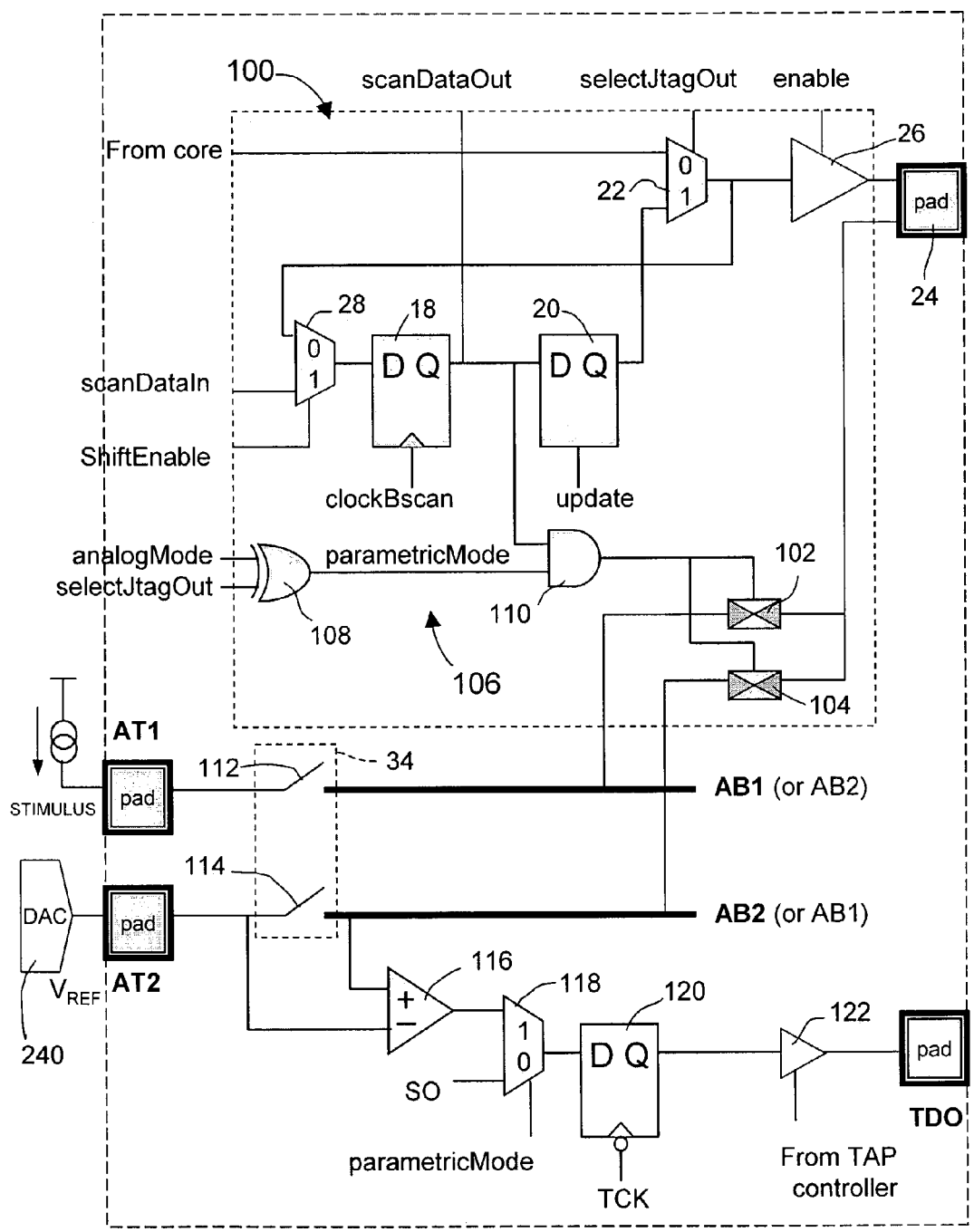
FIG. 5 is a schematic of an 1149.1 boundary scan cell with analog access, constructed according to an embodiment of the present invention.

In the present invention, a single BSSR bit is sufficient to control the digital output value and access to on-chip analog busses. FIG. 5 illustrates an embodiment of the present invention which provides an 1149.1 digital boundary scan cell 100 with analog bus access which provides one bus control bit per pin. The cell is similar to the cell shown in FIG. 3 and, accordingly, the same reference numerals have been used to designate like parts. The circuit of FIG. 5 is provided with two analog switches 102 and 104, in the form of transmission gates, connected to pad 24 and to internal busses AB1 (or AB2) and AB2 (or AB1). Cell 100 further includes a logic circuit 106 which has two mode signals, analogMode and selectJtagOut, as input and which indicate an active instruction according to the following table:

| Instruction | selJtagOut | analogMode |
| --- | --- | --- |
| EXTEST | 1 | 1 |
| PROBE | 0 | 1 |
| PARAMETRIC | 1 | 0 |
| Other | 0 | 0 |

In the embodiment of FIG. 5, logic circuit 106 includes an EXOR gate 108 and a 2-input AND gate 110. The output of EXOR gate 108 is a parametricMode signal. The output of shift register element 18 and the parametricMode signal are applied to AND gate 110. AnalogMode is a signal which is common in 1149.4 boundary module applications to indicate whether a cell is being used in analog or digital mode. SelectJtagOut is common in all test cells to indicate whether the cell is in mission mode or test mode. The output of gate 108 is active (logic 1) only when one of its inputs is active. Thus, the parametricMode signal is logic 1 when either the PROBE or the PARAMETRIC instruction is active, but not when the EXTEST or Other instructions are active.

Alternatively, the parametricMode control could be generated using an AND gate (instead of EXOR gate 108) with one inverting input, so that parametricMode=1 only when SelectJtagOut=1 and analogMode=0. This would prevent any analog bus access to digital pins for any instruction except PARAMETRIC, which may be simpler to use—it would prevent captured data during PROBE to cause bus inadvertent access to signals.

When the EXTEST instruction is active, the circuit of FIG. 5 performs according to 1149.1. The parametricMode signal is logic 0, which disables the analog switches.

The PROBE instruction is unique to 1149.4; hence, 1149.1 is mute on this instruction. When the PROBE instruction is active, 1149.4 requires that analog access to each analog pin be possible, via either, neither, or both analog buses. 1149.4 also requires that analog and digital pins remain in mission mode, connected to the core. During the PROBE instruction, parametricMode is logic 1 which allows analog switches 102 and 104 to be controlled by data in the shift register element 18 and the cell is in mission mode (selectJtagOut is inactive). Because only one bit is available for this digital pin (because it is an input-only, or 2-state output-only, or shares a common enable), both analog switches are either simultaneously enabled or simultaneously disabled. Although this does not allow full 1149.4 analog test capability (because it does not facilitate separate control of the AB1 and AB2 analog switches), 1149.4 does not mandate any analog access to digital pins. The circuit of FIG. 5 facilitates many useful tests, , such as monitoring the pin's mission-mode signal voltage, as discussed later herein.

The PARAMETRIC instruction is not specified by either 1149.1 or 1149.4—it is unique to the present invention. When the PARAMETRIC instruction is active, parametricMode is logic 1, which allows the analog switches to be controlled by data from the BSSR, and the cell is in test mode (selectJtagOut is active). During this mode, Update is suppressed, so that the state of the pin is maintained at whatever state was set to during the most recent EXTEST mode. In PARAMETRIC mode, many parametric tests can be performed, as will be discussed later (such as measuring output drive, pull-up resistance, and input switching point voltage).

During all "Other" instructions, the circuit of FIG. 5 behaves as a normal 1149.1 boundary scan cell.

FIG. 5 shows TBIC switches 112 and 114 associated with analog buses AB1 and AB2, respectively. A comparator 116 has one input connected to internal bus AB2 (or AB1) and its other input connected to external bus contact pin AT2 (or AT1). The output of the comparator is applied to the "1" input of a multiplexer 118 which is controlled by the parametricMode signal. The other input of multiplexer 118 is the scan data out signal SO. The output of the multiplexer is optionally connected to the input of a re-timing element 120 clocked by the test clock TCK. The output of the re-timing element is connected to the TDO pad via pad driver 122.

Figure 6:
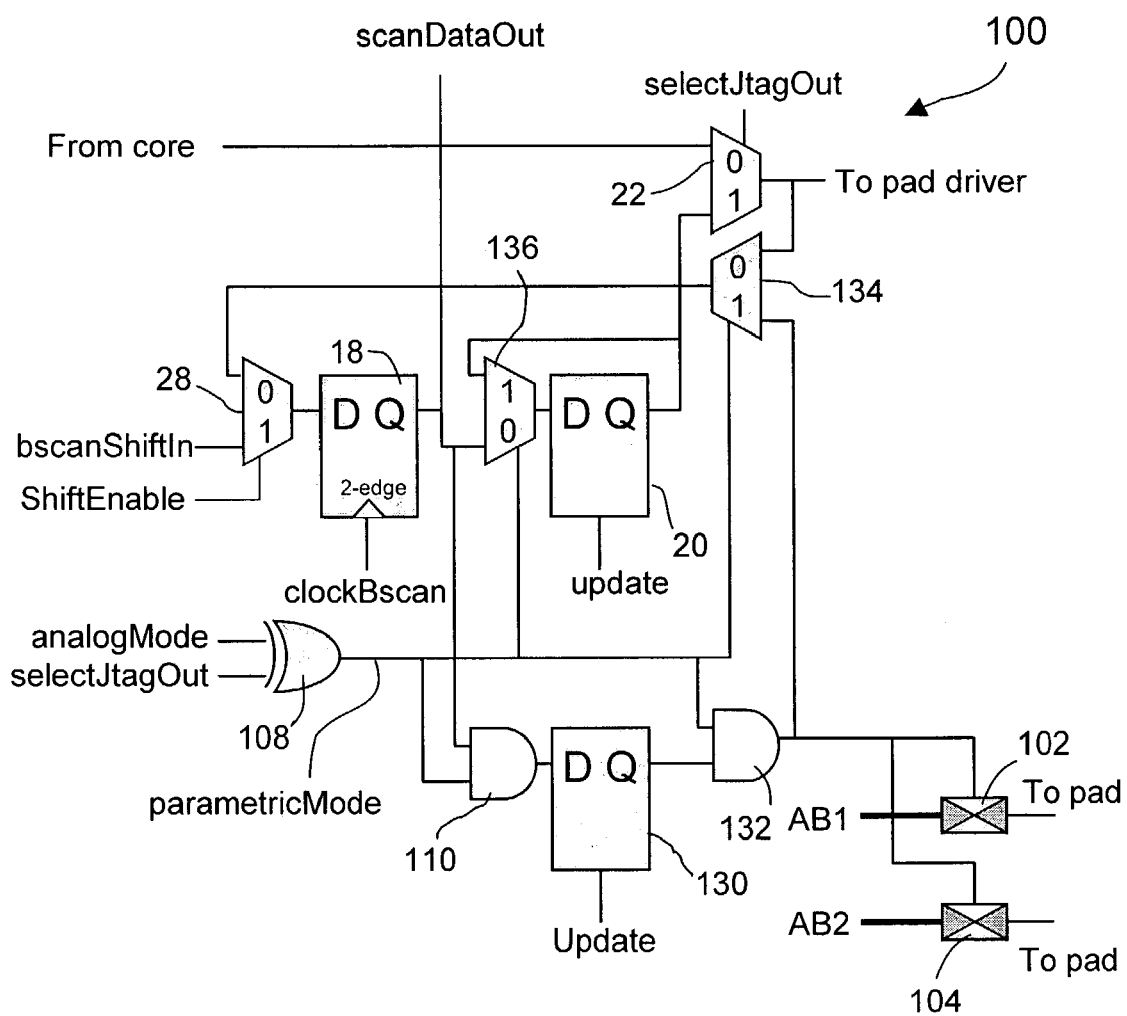
FIG. 6 is a schematic of an 1149.1 boundary scan cell with analog access and which uses one extra latch per pin, in accordance with another embodiment of the present invention the invention.

The circuit of FIG. 6 is similar to that of FIG. 5, but includes an extra update latch 130 so that the state of the analog switch control signal only changes when an update occurs during PARAMETRIC mode. In the PARAMETRIC mode, the state of the analog switch control signal is captured instead of the pad driver data value. The output of pad data update latch 20 is recycled to the latch input to hold the value loaded during the most recent EXTEST mode. This is implemented using multiplexer 136 that is controlled by the parametricMode signal, and whose data inputs are the output of shift register element 18 and the output of update latch 20. The analog switch control signal (output of AND gate 132) value can be captured by the BSSR register, via multiplexers 134 and 28. This is achieved by the provision of an AND gate 132, multiplexer 134 and multiplexer 136. AND gate 132 receives the parametricMode signal and the output of latch 130. Multiplexer 136 operates under control of the parametricMode signal. Multiplexer 134 receives the pad driver signal and the analog switch control signal. During PARAMETRIC mode, for this type of boundary scan cell, the Update operation does not need to be suppressed. No pin transients occur during the BSSR shifting in PARAMETRIC mode (as might occur for the circuit of FIG. 5).

Figure 7:
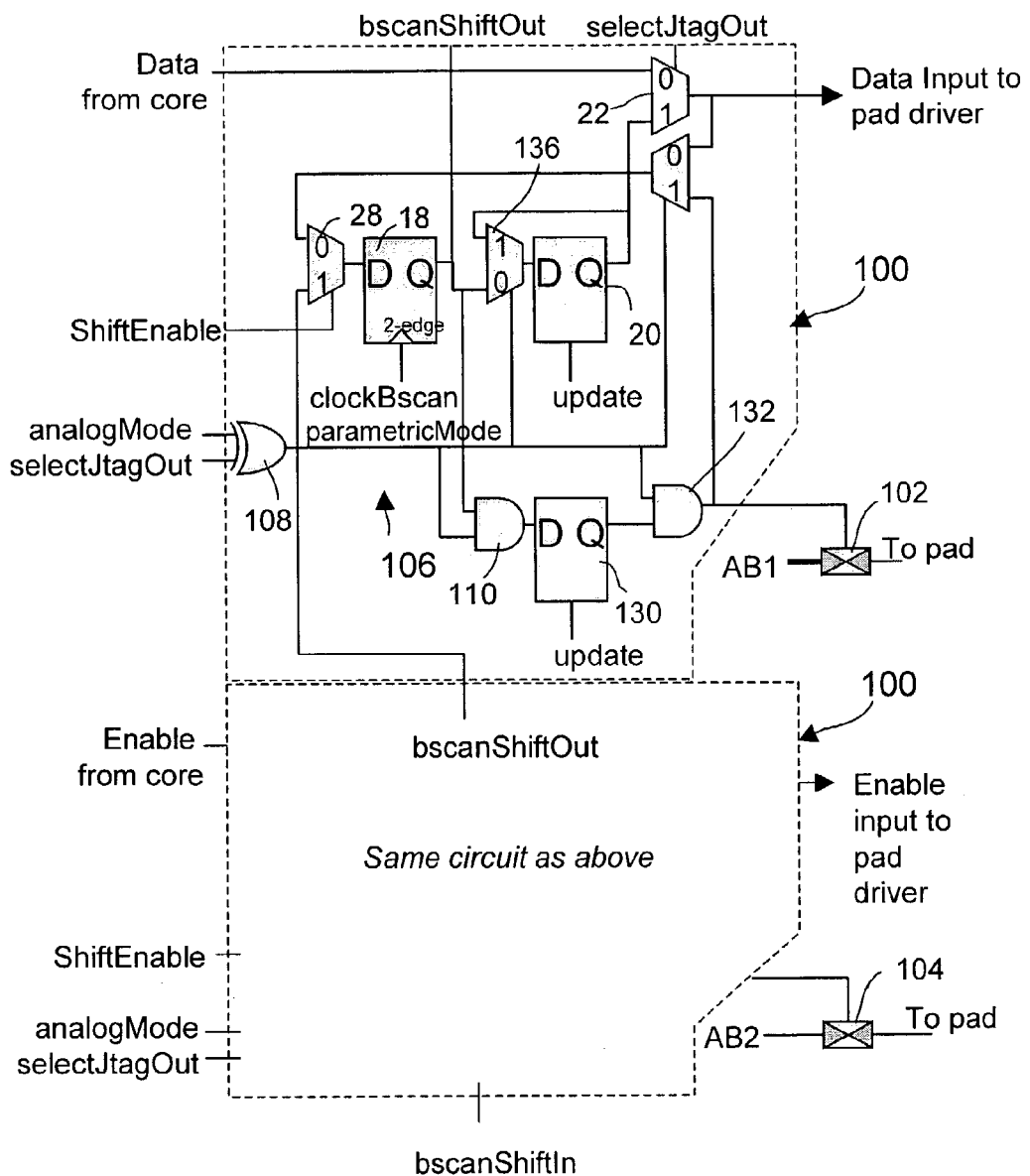
FIG. 7 is a schematic of an 1149.1 boundary scan cell with analog access that uses two bits corresponding to a pin so that AB1 and AB2 switches may be separately controlled, in accordance with another embodiment of the present invention.

According to another embodiment of the present invention, for pins that have two dedicated BSSR bits, typically one for data and another for enable, the circuit of FIG. 7 can be used. For this case, the two analog bus switches 102 and 104 can be controlled separately. In FIG. 7, the data bit controls the AB1 switch 102, and the enable bit controls the AB2 switch 104. This circuit permits the voltage at one pin to be monitored while stimulus current is delivered to a different pin, and thus supports all 1149.4-style analog access.

Applications to 1149.4

The circuit described and claimed in Applicant's aforementioned U.S. patent application Ser. No. 09/768,501 can be modified to obtain the analog boundary module (ABM) circuit 140 of FIG. 8 which performs the function previously described for the PARAMETRIC instruction. The modification comprises the addition of logic circuit 142 which includes OR gate 144 and AND gate 146 with the output of AND gate 146 connected to the clock input of update latches D and C. When PARAMETRIC mode is active (analogMode=0 and selectJtagOut=1) and an Update-DR state occurs, the ABM 140 of FIG. 8 performs a partial update: only the latches B1 and B2 are updated. During this mode, the state of the pin is maintained at whatever state was set to during the most recent EXTEST mode. Thus, this circuit does not need the FullUpdate signal described in the prior application—the information is instead encoded into Mode1 (selectJtagOut) and Mode2 (analogMode).

Figure 9:
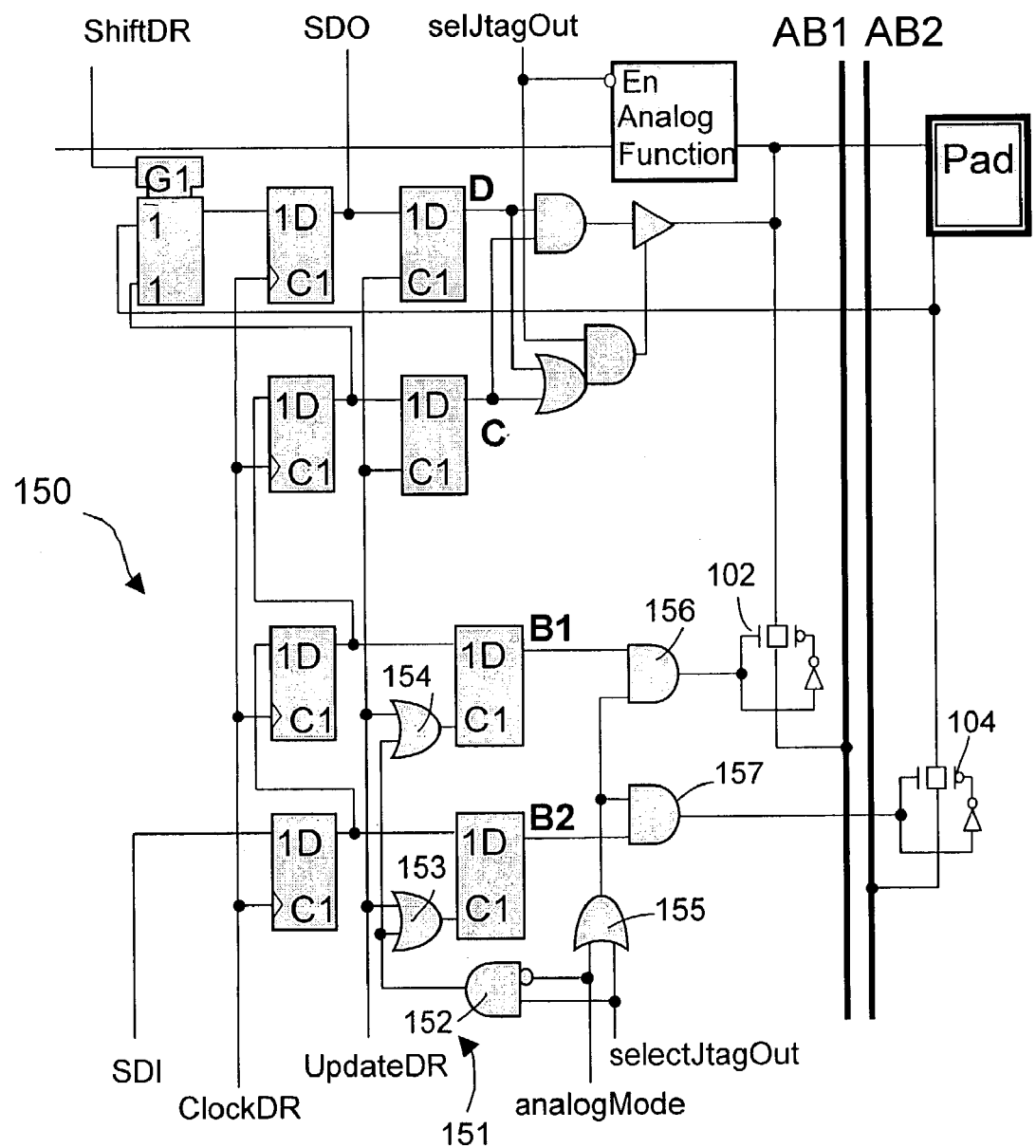
FIG. 9 is a schematic of an 1149.4 analog boundary module with selectably continuous update of two of the register bits, in accordance with another embodiment of the present invention.

A different embodiment is shown in circuit 150 of FIG. 9. Analog switches 102 and 104 are enabled during the Shift-DR state, similar to the operation of the circuit in FIG. 5. In circuit 150, a logic circuit 151, comprised of AND gate 152 and OR gates 153 and 154, is connected to the clock input of switch control latches B1 and B2. As can be seen, the AND gate receives the selectJtagOut signal and an inverted analogMode signal and generates a parametric mode signal output. The OR gates receive the output of AND gate 152 and the Update-DR signal. The selectJtagOut and analogMode signals are also applied to the inputs of an OR gate 155 whose output is applied to one input of each of AND gates 156 and 157 which control analog switches 102 and 104.

Methodology

During PARAMETRIC mode for the circuit of FIG. 5, the normal sequence of TAP controller states is used, and all logic 0's and a single logic 1 are shifted into the BSSR, via the circuit TDI, during the Shift-DR state. As the logic 1 is shifted into each BSSR element that controls an analog switch pair, the switches (transmission gates) are enabled, the stimulus current is conveyed to the pin via AT1 and AB1 (the AT1/AB1 TBIC switch is enabled), and the pin voltage will be conveyed to AB2. If the AB2/AT2 TBIC switch is enabled, the voltage will be conveyed to AT2 where it can be measured. If the AB2/AT2 TBIC switch is disabled, the voltage on AB2 is compared to the voltage on AT2 and the comparison result is output via TDO.

During PARAMETRIC mode for the circuits of FIGS. 11–14, the Capture-DR state action is suppressed. All logic 0's and a single logic 1 are shifted into the BSSR, and then an update is performed during the Update-DR state to enable analog access to a pin. Then, the logic 1 is shifted along the BSSR to a next pin of interest, and another update is performed in sequence to enable analog access to the next pin, without a Capture-DR operation over-writing the single 1 and many 0's.

Figure 1:
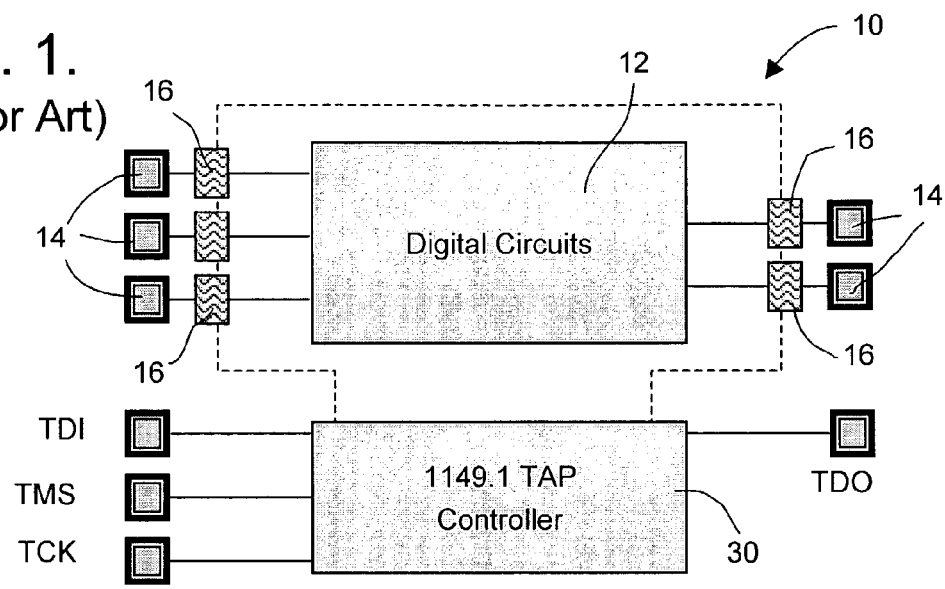
FIG. 1 is prior art architecture of 1149.1-compliant IC.
Figure 1A:
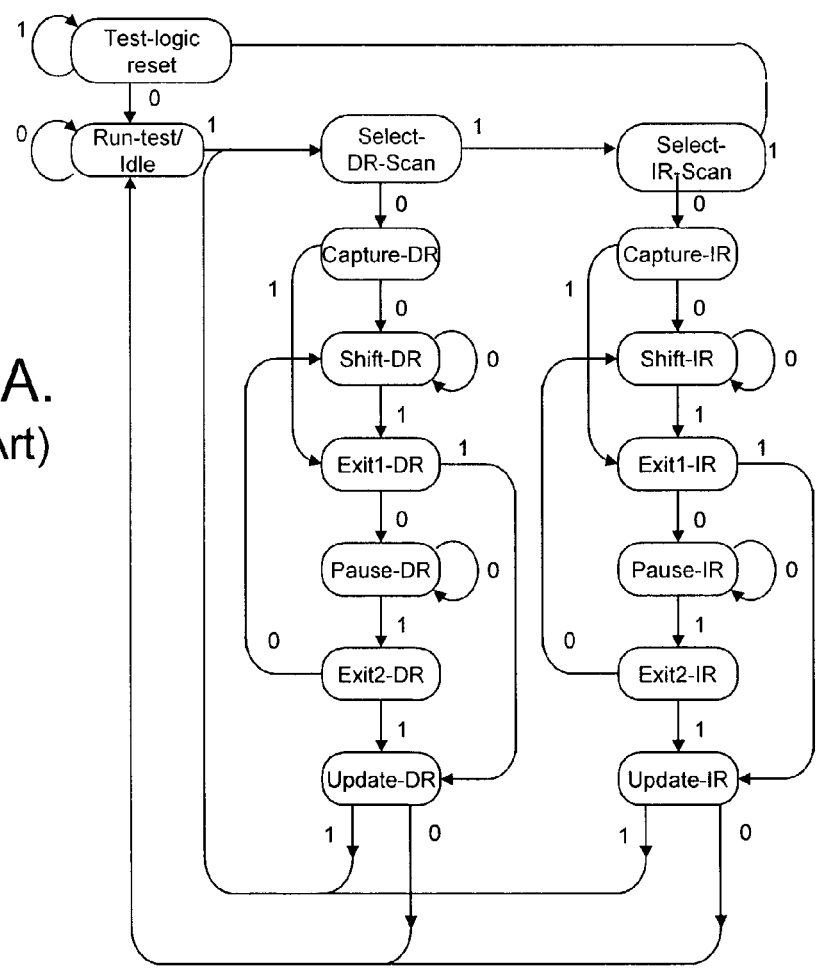
FIG. 1A is a state diagram of an 1149.1 Test Access Port (TAP) Controller.
Figure 2:
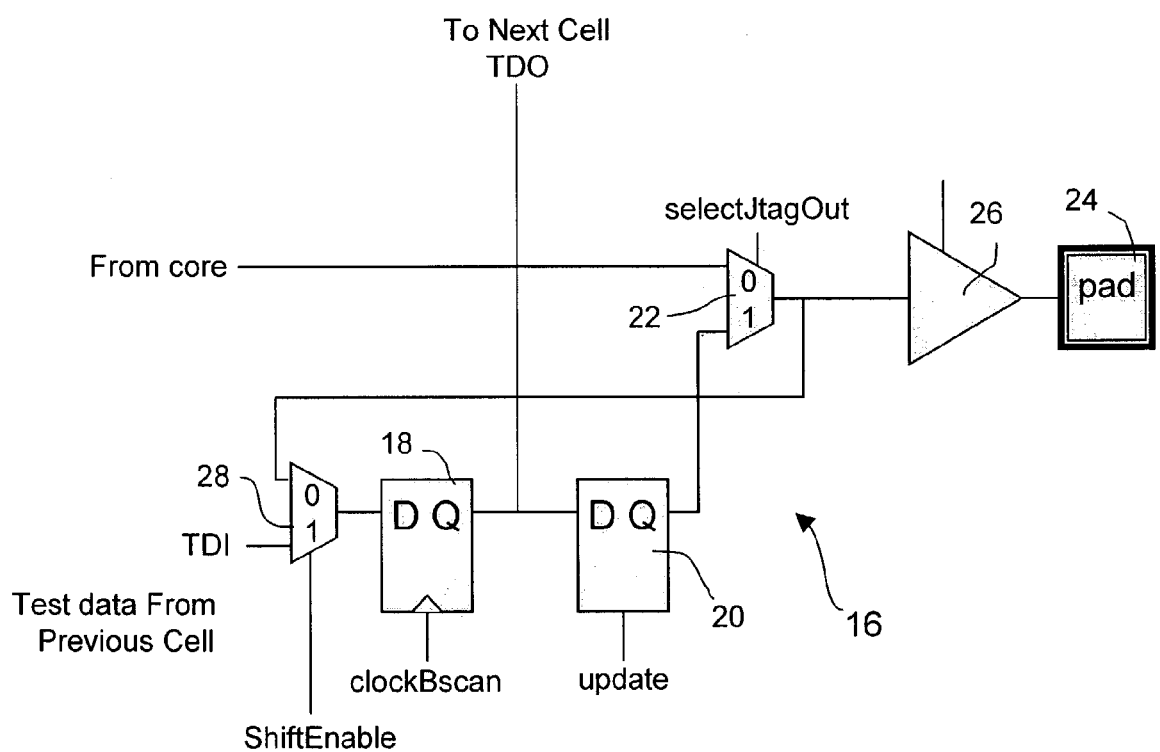
FIG. 2 is a prior art schematic of a typical 1149.1 boundary scan cell.

Preferably, an IC would contain a consistent set of boundary scan cells, constructed according to the present invention, for its analog and digital pins. Specifically, it would contain conventional 1149.1 digital boundary scan cells, such as the prior art shown in FIG. 2, 1149.1 digital boundary scan cells with analog access, as shown in FIG. 5, conventional 1149.4 ABMs, such as the prior art shown in FIG. 4, and analog boundary modules, as shown in FIG. 9. This combination of boundary scan cells never requires a suppressed Capture function, but cannot isolate the on-chip analog buses from the pins when logic 1's are shifted in PARAMETRIC mode.

Figure 8:
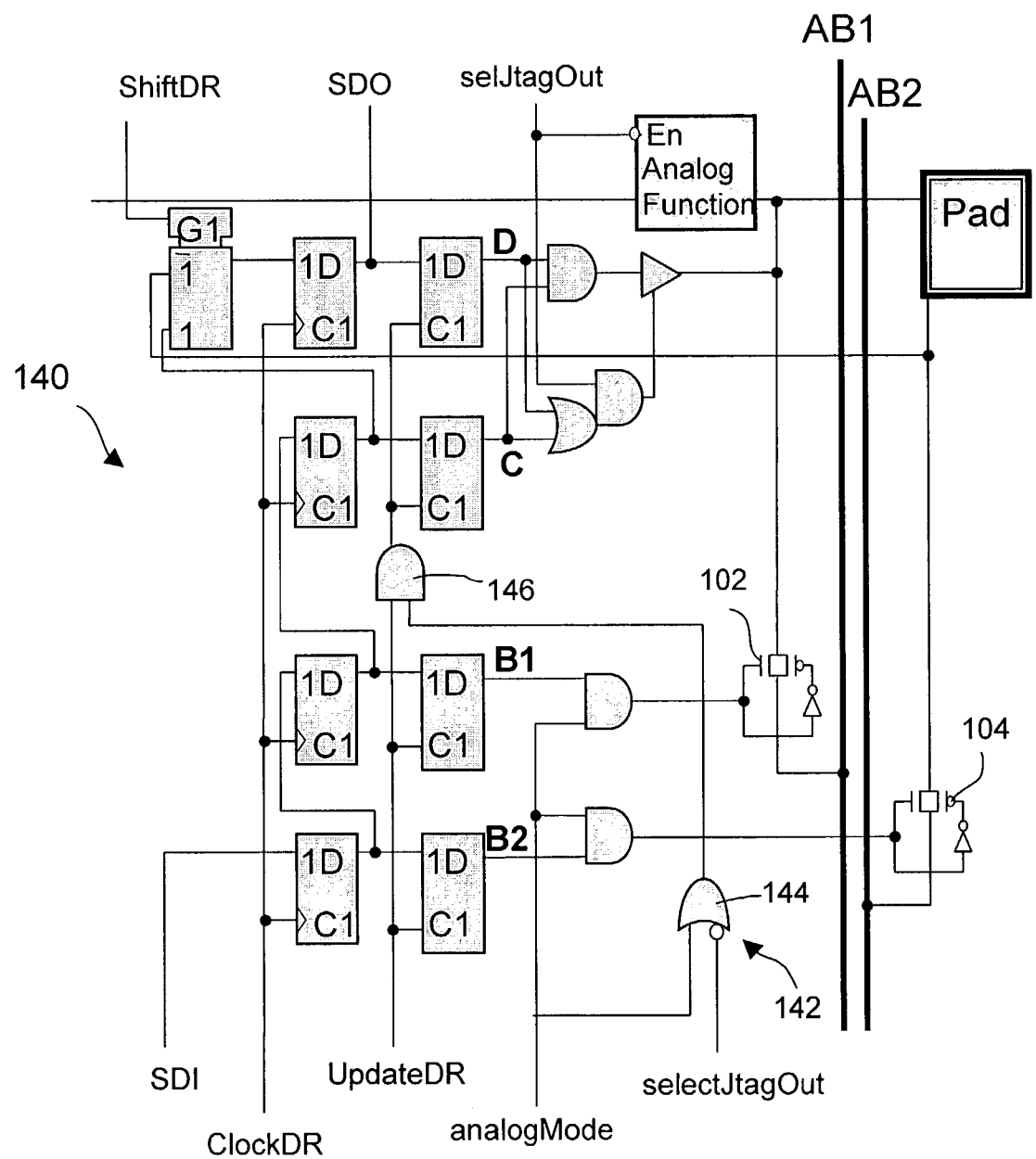
FIG. 8 is a schematic of an 1149.4 analog boundary module with partial update of the four register bits, in accordance with another embodiment of the present invention.

Alternatively, the IC would contain conventional 1149.1 digital boundary scan cells, 1149.1 digital boundary scan cells with analog access, as shown in FIGS. 6 and 7, conventional 1149.4 ABMs, and analog boundary modules, as shown in FIG. 8—this combination of boundary scan cells requires a suppressed Capture, but isolates the on-chip analog buses from the pins while shifting in PARAMETRIC mode. However, both types of boundary scan cells can work correctly on the same IC.

Figure 10:
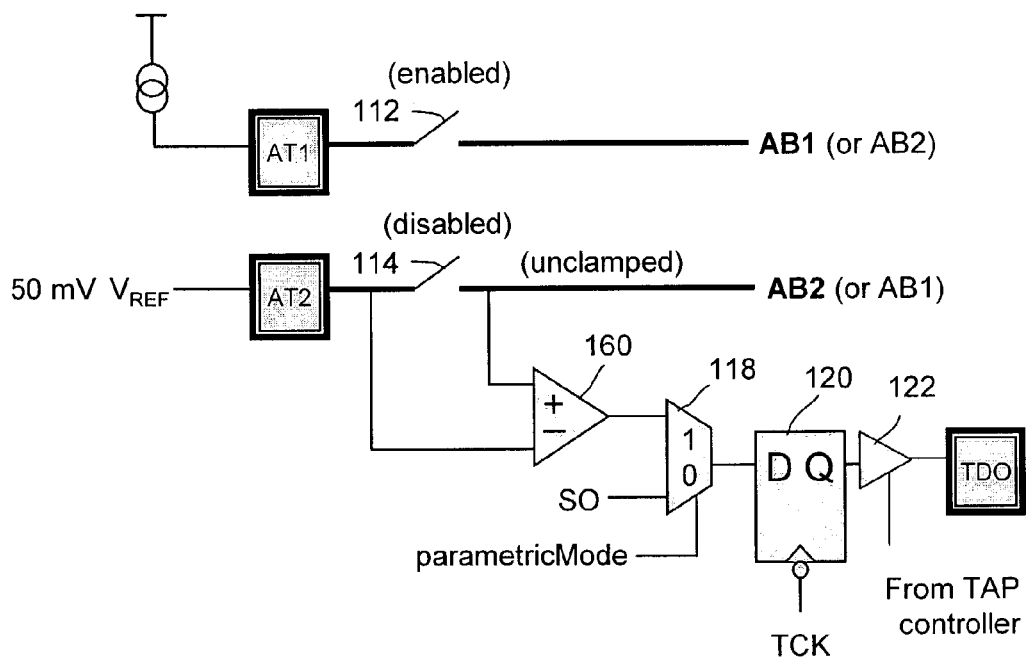
FIG. 10 is a schematic of an 1149.4 test bus interface circuit (TBIC) that compares the on-chip and off-chip bus voltages, and provides the comparison result at TDO, in accordance with an embodiment of the present invention.
Figure 10:
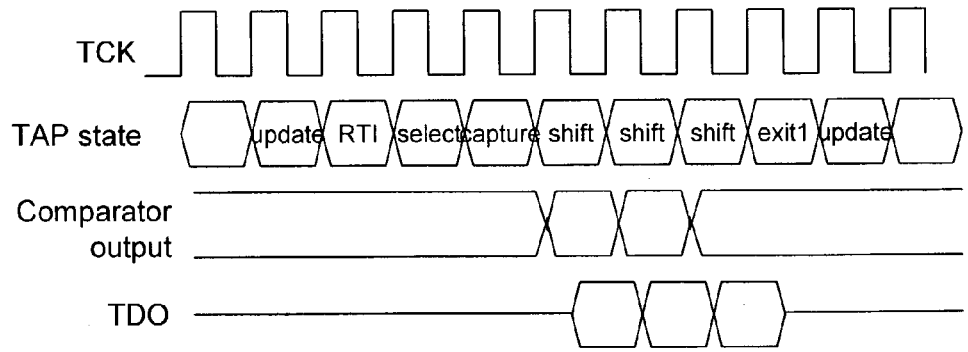

As shown in FIG. 10, to perform comparisons between each pin's voltage and an externally supplied reference voltage, $V_{REF}$, a comparator 160 is connected between on-chip analog bus AB2 and the off-chip analog bus AT2. Of course, the TBIC switch between AB2 and AT2 must be disabled when these two buses are compared. The output of the comparator is output to the TDO pin after re-timing (if needed) so that transitions occur following the falling edge of TCK and well in advance of TCK rising. The TDO output driver is enabled, according to 1149.1, only during the Shift-DR (or Shift-IR) state. A multiplexer selects the comparator output when PARAMETRIC mode is active, and the normal scan data output otherwise.

The state of all output pins of all chips controlled via the 1149.1 TAP signals is constant while the Shift-DR state is active. Therefore, the values shifted out via TDO during the PARAMETRIC mode are the same as would be output if a comparator were located within every boundary module and the comparator outputs captured within each pin's BSSR element. The two approaches give essentially the same results, but using a single comparator (connecting AB2 and AT2) uses less area on the semiconductor, conveniently permits an adjustable reference voltage to be used, and permits a higher performance comparator (or a selection of comparators) to be used.

Figure 11:
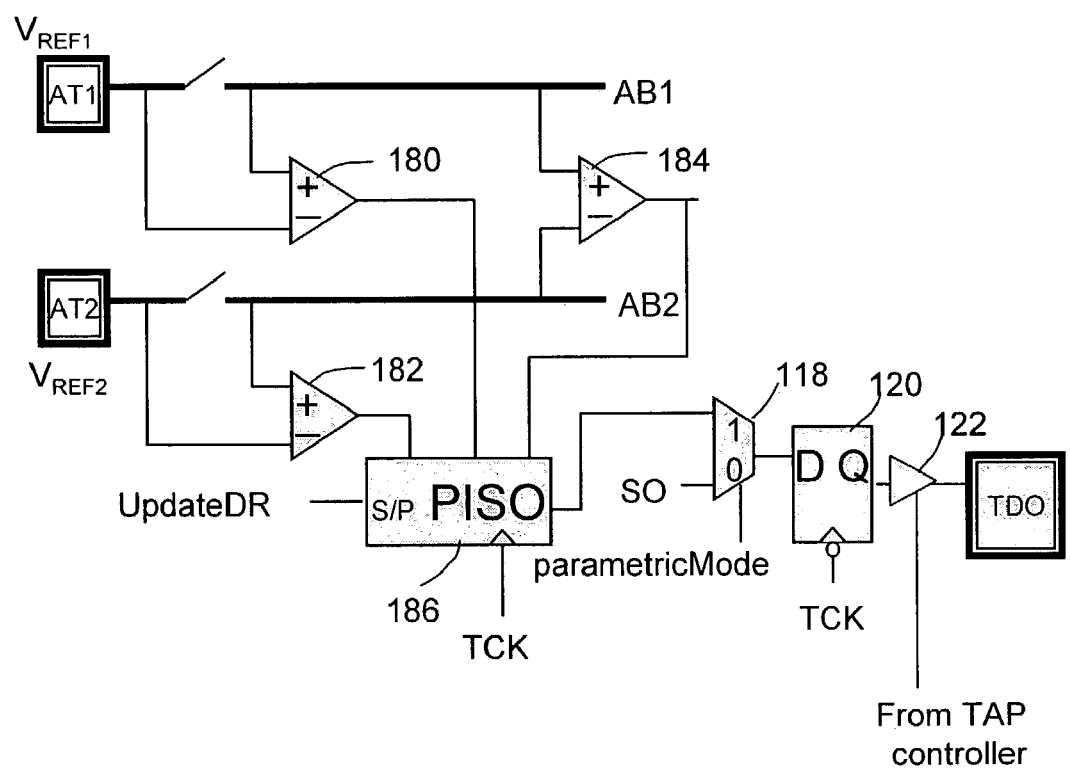
FIG. 11 is a schematic of an 1149.4 test bus interface circuit that compares the on-chip and off-chip bus voltages, and also compares the on-chip bus voltages to each other, and provides the comparison result at TDO, in accordance with an embodiment of the present invention.

The circuit in FIG. 11 shows how comparators can be connected to both analog buses, and is especially suitable for testing differential pin pairs. A comparator 180 compares the signal on AB1 to the reference voltage on AT1. A comparator 182 compares the signal on AB2 to the reference voltage on AT2. A comparator 184 compares the signal on AB1 to the signal on AB2, which generates a differential logic value if AB1 and AB2 are connected to a differential signal pair. A parallel input, serial output (PISO) shift register 186 captures all three comparator outputs and shifts them out through TDO, when in PARAMETRIC mode and after optional re-timing to the falling edge of TCK.

Figure 12:
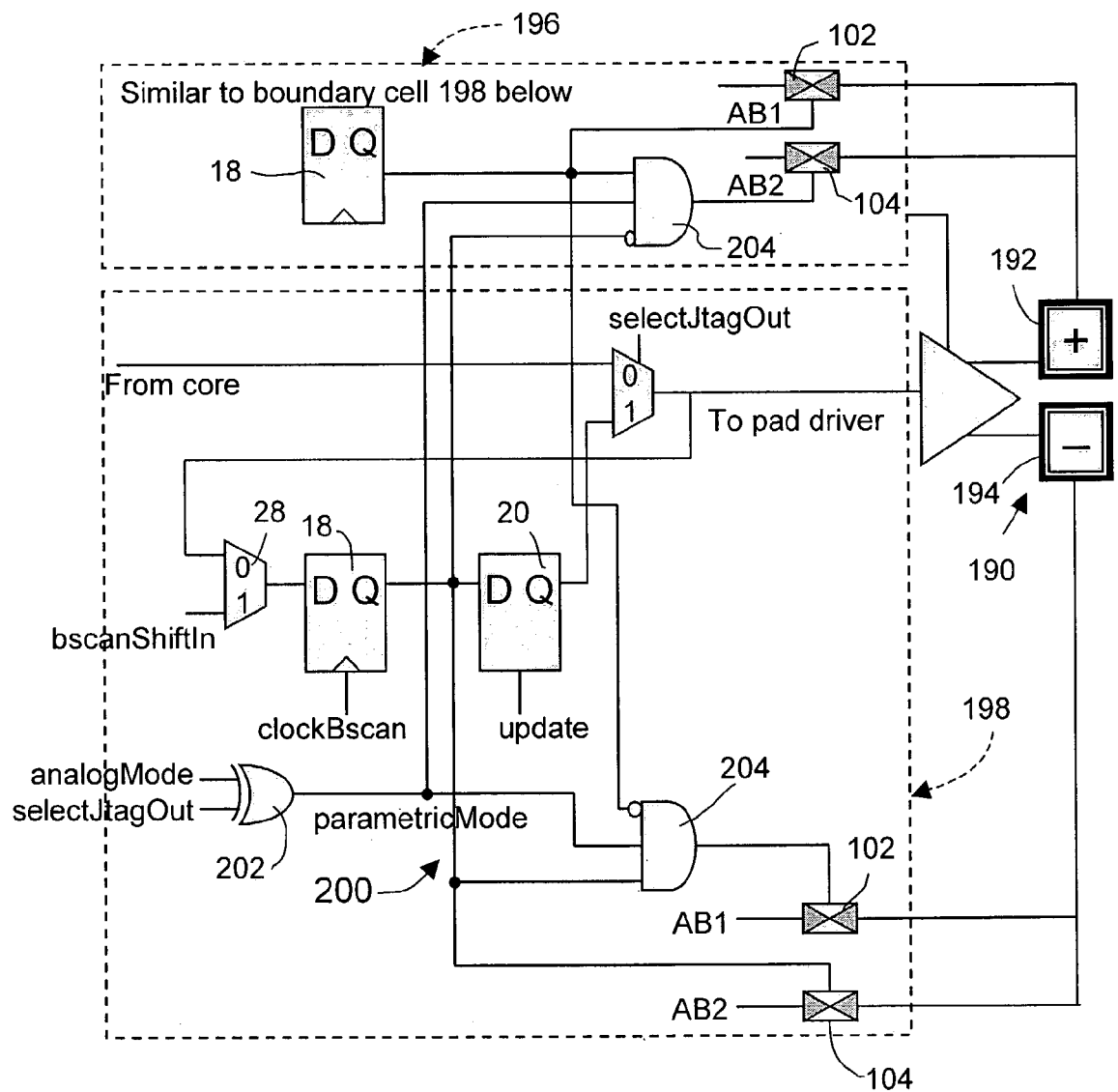
FIG. 12 is a schematic of an 1149.1 boundary scan cell with analog access for differential pins, in accordance with another embodiment of the present invention.

The circuit of FIG. 12 shows how the analog buses can be connected to a differential pin pair 190, which includes a non-inverting pin ("+") 192 associated with boundary scan cell 196 and an inverting pin ("−") 194 associated with a second boundary scan cell 198. Test cell 196 contains all of the circuitry of test cell 198; however, for simplicity some of the circuitry has not been shown for test cell 196.

Each of test cells 196 and 198 includes a logic circuit 200 for generating the parametricMode signal and analog switch control signals. The logic circuit includes EXOR gate 202 and a three input AND 204. The analogMode signal and the cell mode signal, selectJtagOut, are applied to gate 202. The outputs of AND gates 204 are applied to the control inputs of the associated cell analog switches 102 and 104. Both switches of cell 196 are connected to the "+" pad. Both switches of cell 198 are connected to the "−" pad. Each AND gate receives the shift register output of its respective shift register element, the parametricMode signal and the inverted output of the shift register element of the other cell of the differential pair.

Thus, with parametricMode active, when all logic 0's and a single logic 1 are shifted into the BSSR, each of the pins of the differential pair will be accessed sequentially, as in the previously described embodiments. However, the two 3-input AND gates 204 in logic circuit 200 allow a second option—loading a pair of logic 1's instead of a single logic 1. When a pair of logic 1's is detected in the two BSSR bits corresponding to the differential pin pair, instead of a single logic 0, the non-inverting pin ("+") is connected to AB1 and the inverting pin ("−") is connected to AB2, thus allowing a differential access. If the comparators are connected as shown in the circuit of FIG. 11, then the differential voltage is compared, and simultaneously the two single pin voltages are compared to off-chip reference voltages.

Figure 13:
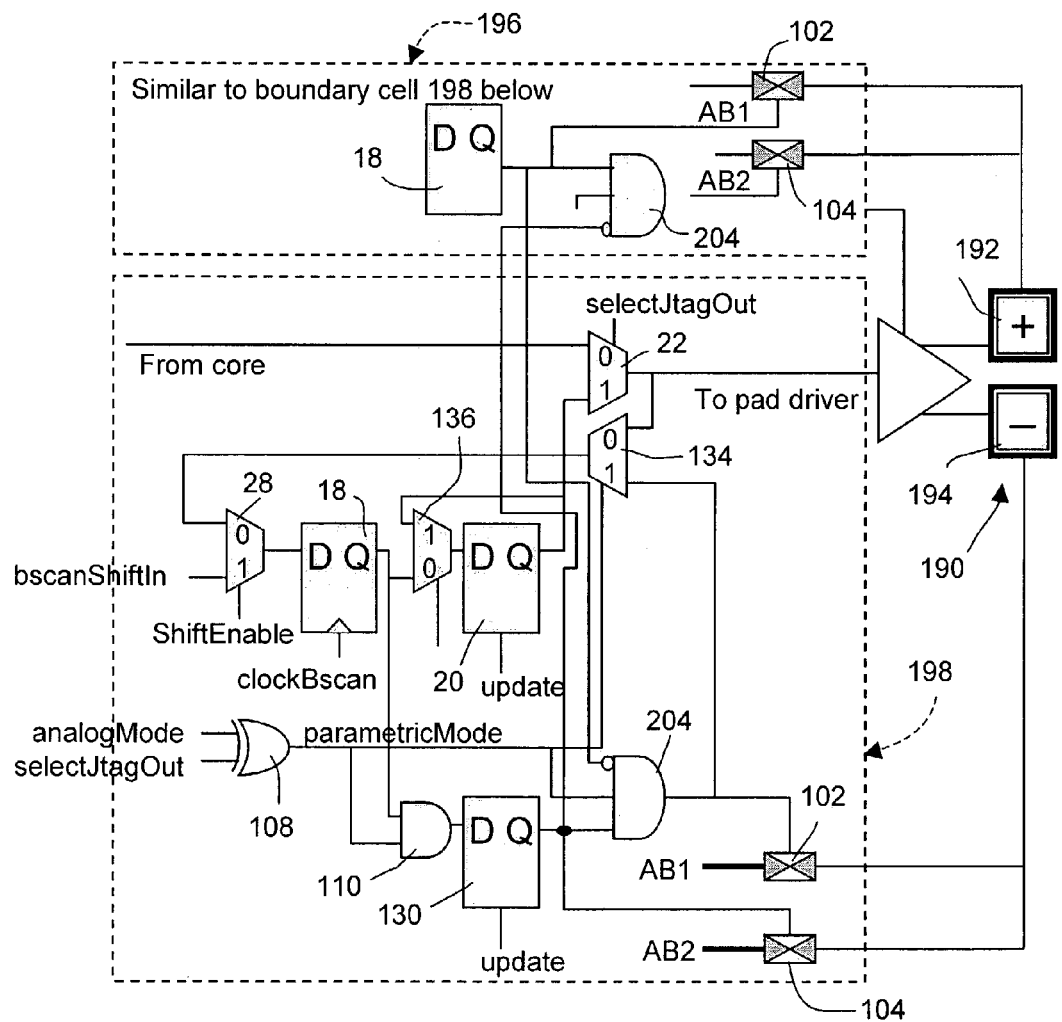
FIG. 13 is a schematic of an 1149.1 boundary scan cell with analog access for differential pins and which uses one extra latch per pin, in accordance with another embodiment of the present invention.

The circuit of FIG. 13 is similar to the circuit of FIG. 12, except that cells 196 and 198 include update latches 130 and associated components are provided for the same purpose as that previously described in connection with the circuit of FIG. 6.

Figure 14:
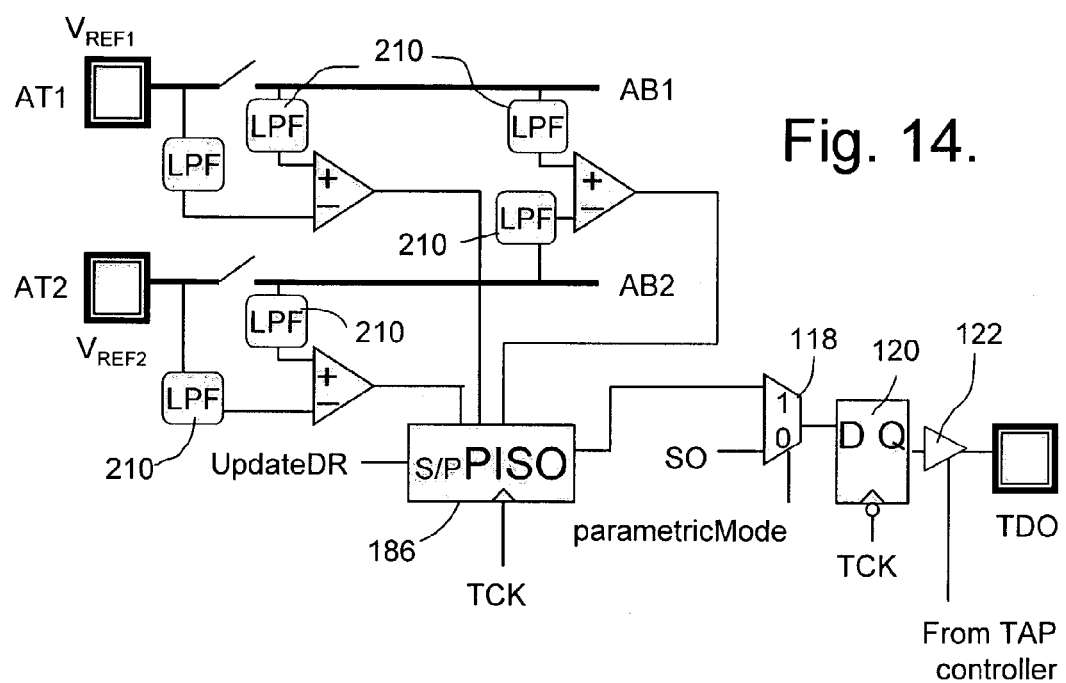
FIG. 14 is a schematic of an 1149.4 test bus interface circuit similar to FIG. 11, except that signals are low pass filtered before comparing them, to allow comparison of noisy signals in accordance with another embodiment of the present invention.

For particularly noisy environments, the analog bus signals can be low pass filtered by means of low pass filters 210 prior to comparing, as shown in the circuit of FIG. 14.

Figure 15:
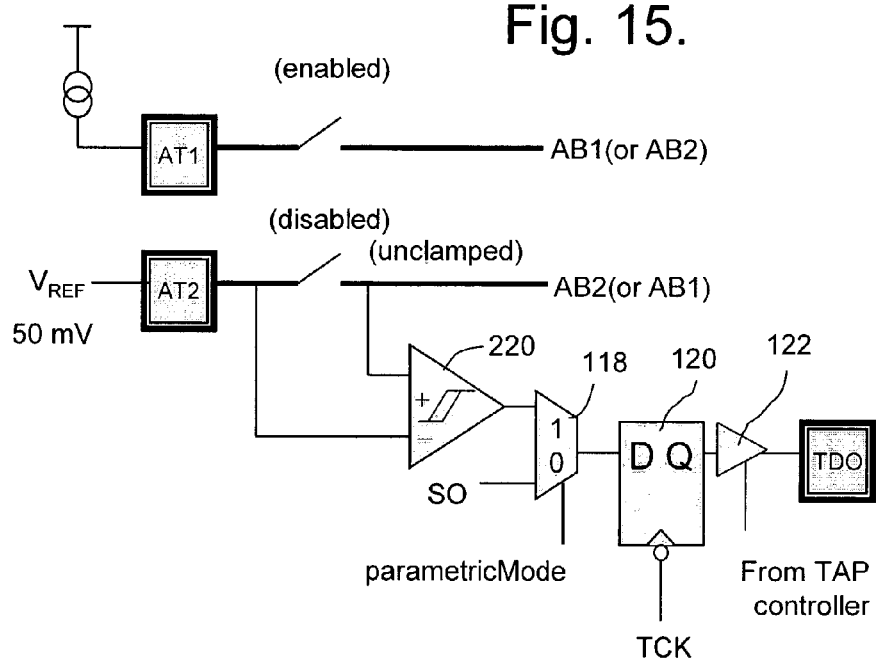
FIG. 15 is a schematic similar to FIG. 10, except that the comparator has hysteresis on its input from the on-chip analog bus, to allow comparison of AC-coupled signals, in accordance with another embodiment of the present invention.
Figure 16:
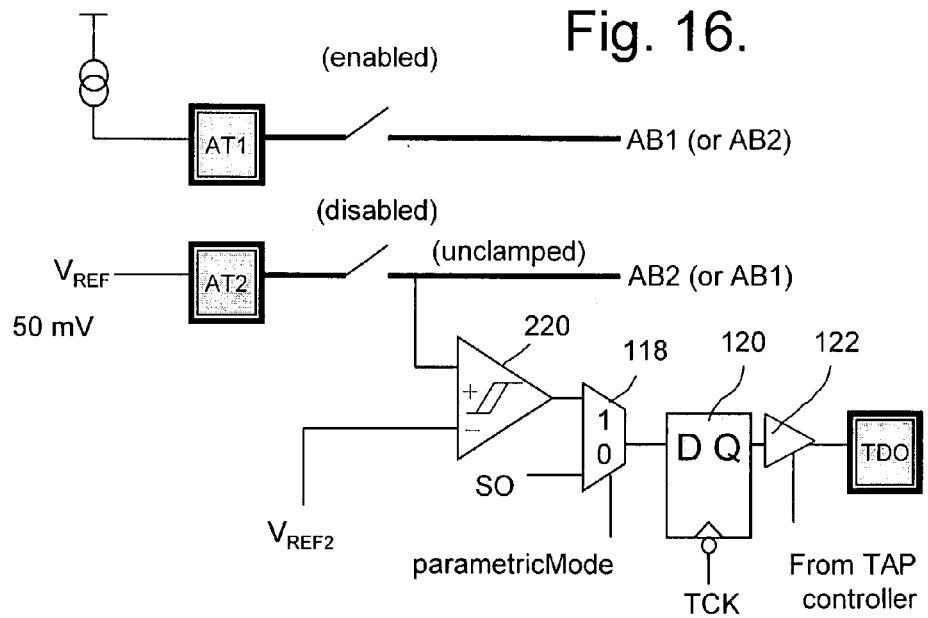
FIG. 16 is a schematic similar to FIG. 10, except that the comparator is connected to a fixed reference voltage that is the bias voltage for AC-coupled signals, in accordance with an embodiment of the present invention.

An alternative technique for handling noisy signals, or for signals that are AC-coupled to the IC pins, is to use a Schmitt-trigger comparator 220, as shown in FIG. 15. The Schmitt-trigger comparator changes its apparent switching point voltage depending on the present logic value at its output. If the output of the comparator is logic 1, then the input switching point for the positive input is decreased slightly. If the output of the comparator is logic 0, then the input switching point for the positive input is increased slightly. This permits the circuit to test signals that are AC-coupled to the pin. If transitions are induced on the pin's signal, through the AC-coupling, the momentary signal spikes received by the pin will cause the Schmitt-trigger comparators to change state. The transitions occur simultaneously with the rising edge of TCK, as required by 1149.1, and the comparator output changes state in time to be latched by the TDO re-timing flip-flop. The circuit shown in FIG. 16 is similar to that in FIG. 15, except that the reference voltage for comparator 220 is the constant reference voltage used for terminating the single-ended or differential signals being accessed at the pins.

The circuit of FIG. 17 is similar to the circuit FIG. 10, except that a strobed comparator 222 is used instead of a continuously operating comparator. Strobed comparators typically use less power and achieve higher performance (accuracy, resolution, and speed). TCK is the strobe signal, and as shown in the waveforms, the comparator makes a comparison on the rising edge of TCK. Other timing is possible.

Figure 18:
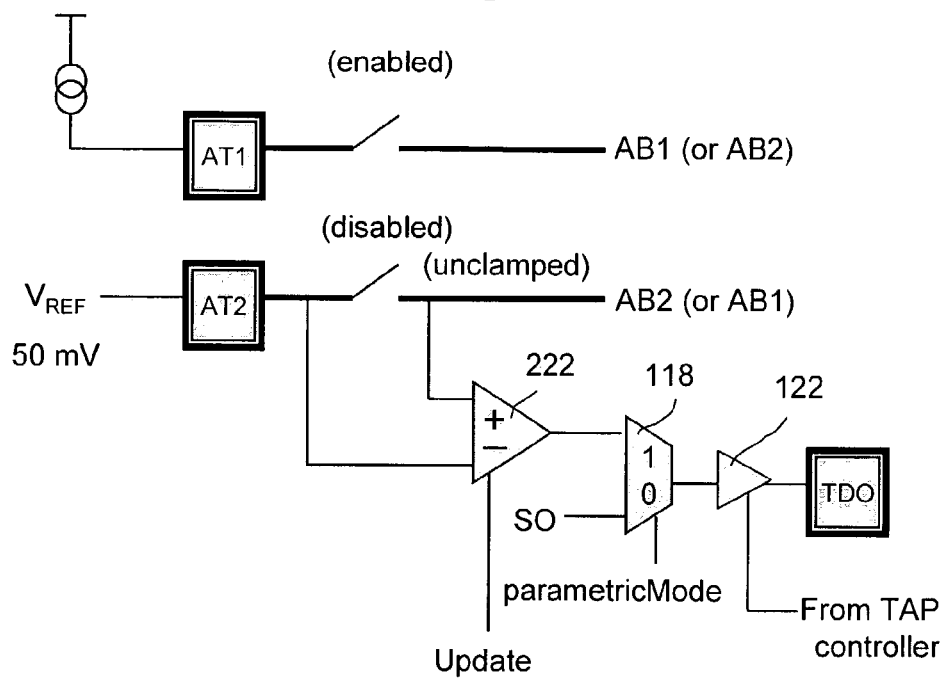
FIG. 18 is a schematic similar to FIG. 10, except that the comparator is strobed by the Update-DR signal, and is not re-timed before delivery to TDO, in accordance with an embodiment of the present invention.
Figure 18:
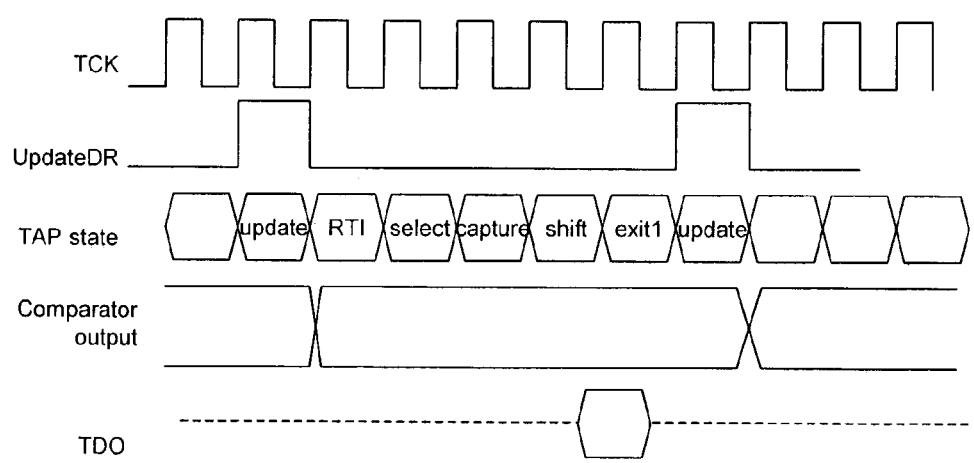

The circuit of FIG. 18 is similar to the circuit of FIG. 17, except that the Update-DR state is used to strobe the comparator. This only permits one output result per update.

Figure 19:
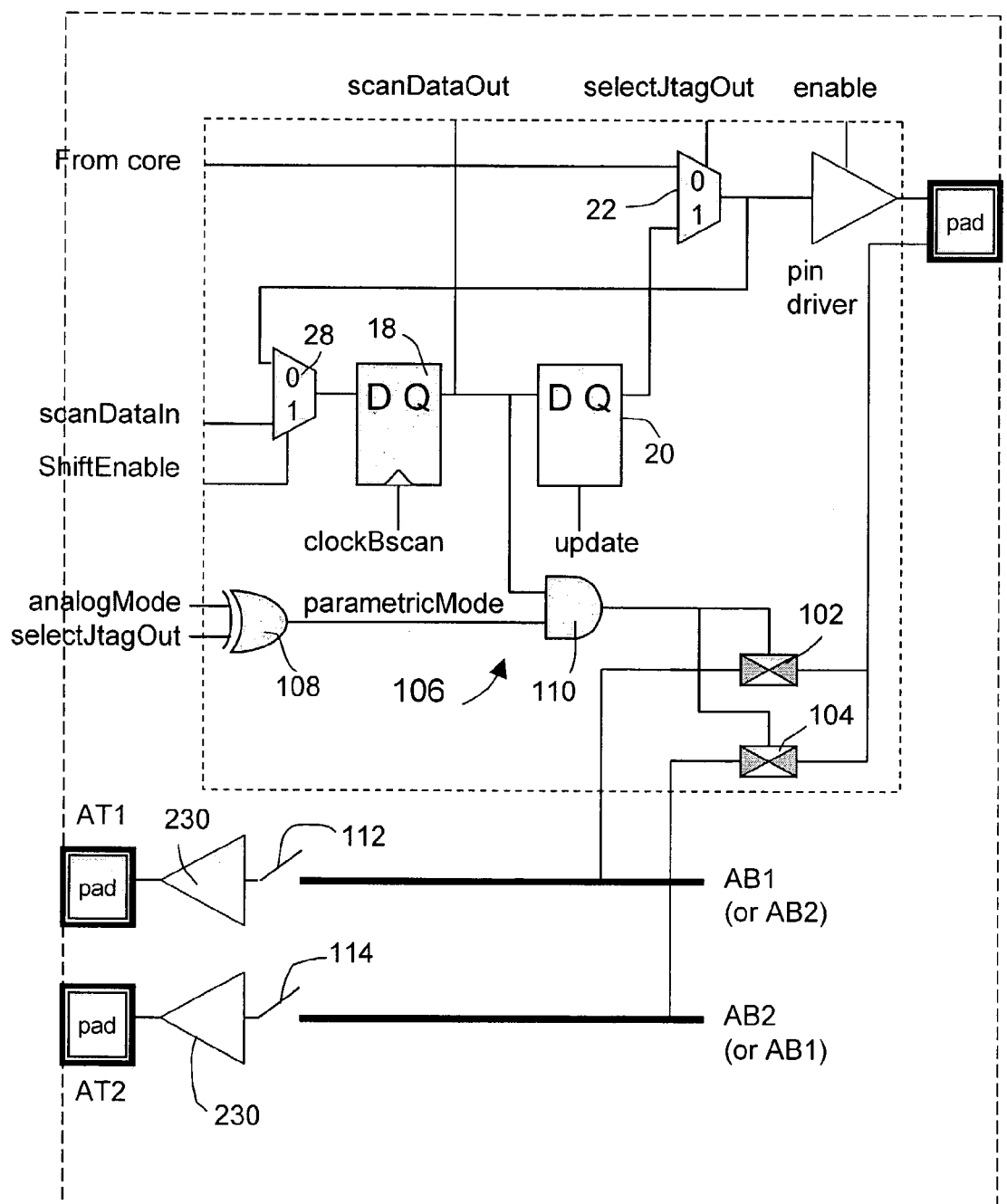
FIG. 19 shows a configuration in which the signals on AB1 and AB2 are buffered by analog buffers, in accordance with another embodiment of the present invention.

The circuit of FIG. 19 shows a configuration in which the signals on AB1 and AB2 are buffered by analog buffers (op-amps) 230, as permitted by 1149.4. The invention facilitates sequentially accessing pin signals, as previously described herein, and the resulting analog signals driving the AT1 or AT2 pins, so that the signals can be evaluated off-chip. In this case, the result is output via AT1 and AT2 instead of via TDO. The various other boundary scan circuits of the present invention can also be used instead of the one shown in FIG. 19.

Function and performance (especially offset) of the comparators used in FIGS. 5, 10, 11, 14, 15, 16, 17, and 18 can be easily tested (calibrated) because all inputs and outputs are accessible via AT1, AT2, and TDO. As can be seen in FIG. 4, the TBIC has an additional switch between AT1 and AB2, and between AT2 and AB1—these are for calibrations like that needed for the comparators just described.

Output via TDO is shifted out with regular timing, therefore the result can be shifted out via the boundary scan circuitry of other chips on a circuit board.

The practicality of using high performance comparators, with off-chip adjustable reference voltage means that the invention can also be used to sample the pad voltages of small-swing signals, such as low voltage differential signals (LVDS) and other differential signals.

The scan rate, when sequentially accessing pin voltages is limited by RC, where R=500 ohms for the ABM switch +100 ohms for the a typical pad driver, and C=5 pF for a typical AB2 on-chip analog bus, so 10*RC=30 ns, therefore, the maximum TCK frequency for this example is 30 MHz, which is faster than the present typical TCK frequency of 1~10 MHz.

The reference voltage supplied to AT1 and AT2 can be supplied by a digital to analog converter (DAC) 240 as shown in FIG. 5, so it is practical to generate a different reference voltage for each pin voltage comparison—this is not possible when a comparator is connected within each ABM and its output captured within each ABM.

The stimulus current can be generated by test equipment off-chip, or within another IC on the circuit board, or within the IC whose pin capacitance is being tested. Similarly, the response voltage can be monitored by test equipment off-chip, or within another IC on the circuit board, or within the IC whose pin is being tested. For example, the stimulus current could be generated within each IC by a constant current source, and the voltage could be monitored by a comparator whose logic output level changes when the pin voltage exceeds a reference voltage connected to the other input of the comparator.

The 1149.4 standard defines a test access port (TAP) that has 4 or 5 pins dedicated to test access. It also permits these pins to be switched between test and non-test functions using a "compliance-enable" pin. However, it is possible to maintain control of test functions via the TAP controller when the TAP pins are in non-test mode. A function-mode data bus can be used to send data directly to the TAP controller within the IC, bypassing the TAP pins completely. The present invention anticipates this type of access, so that the number of pins dedicated to providing test access for measuring pin capacitances can be minimized. Also, the two analog buses could be entirely within each IC, without the dedicated analog test pins AT1 and AT2 (however this arrangement would not be compliant with the 1149.4 standard).

Although the present invention has been described in detail with regard to preferred embodiments and drawings of the invention, it will be apparent to those skilled in the art that various adaptions, modifications and alterations may be accomplished without departing from the spirit and scope of the present invention. Accordingly, it is to be understood that the accompanying drawings as set forth hereinabove are not intended to limit the breadth of the present invention, which should be inferred only from the following claims and their appropriately construed legal equivalents.

I claim:

1. A boundary scan cell for use in a circuit having a boundary scan shift register (BSSR) having boundary scan cells, each boundary scan cell being associated with a predetermined pin of said circuit and comprising:
   a single-bit shift register element that outputs a bit value;
   an update latch associated with said single-bit shift register element, said update latch latching said bit value to control the logic state of the pin associated with said boundary scan cell;
   analog switches connecting the pin associated with said boundary scan cell to analog test buses in said circuit; and
   logic circuitry, responsive to a cell mode signal, having a parametric test mode in which said single-bit shift register element controls said analog switches.

2. A boundary scan cell as defined in claim 1, said logic circuitry being responsive to a combination of said cell mode signal and an analog mode signal.

3. A boundary scan cell as defined in claim 2, further including a second update latch for maintaining the logic state of control signal of said analog switches.

4. A boundary scan cell as defined in claim 2, said logic circuitry including a first gate for generating a parametric mode signal having the logic value of said combination of said cell mode signal and an analog mode signal; and a second gate responsive to said parametric mode signal and said bit value for generating an analog switch control signal.

5. A boundary scan cell as defined in claim 4, further including:
   a first selector responsive to said parametric mode signal for connecting one of a cell output and said analog switch control signal to an input of said shift register element; and
   a second selector responsive to said parametric mode signal for connecting one of the output of said shift register element and the output of said update latch to the input of said update latch.

6. A boundary scan cell as defined in claim 5, wherein during said parametric test mode, said logic circuitry suppresses update of said associated pin logic state and enables update of an analog switch-control latch.

7. A boundary scan cell as defined in claim 5, wherein, during said parametric test mode, said logic circuitry enables said shift register element to control said analog switches while bits are shifting in said BSSR.

8. A boundary scan cell as defined in claim 5, said circuit further including a comparator having inputs connected to an analog bus that is connected to pins under test and another bus, said comparator having an output connected to a test data output.

9. A boundary scan cell as defined in claim 8, said circuit further including a selector for selecting between said serial test data output and said comparator output under control of said parametric mode signal.

10. A boundary scan cell as defined in claim 1, wherein during said parametric test mode, said logic circuitry suppresses update of said associated pin logic state and enables update of an analog switch-control latch.

11. A boundary scan cell as defined in claim 1, wherein during said parametric test mode, said logic circuitry enables said shift register element to control said analog switches while bits are shifting in said BSSR.

12. A boundary scan cell as defined in claim 1, wherein, for a pair of scan cells associated with a differential pin pair, said logic circuitry in said pair of scan cells being interconnected so that one of said analog switches of each scan cell of said pair of scan cells is controlled by said parametric mode signal and a combination of the bit values of said scan cells, and the other analog switch of each scan cell of said pair of scan cells is controlled by a combination of said parametric mode signal and only the bit value of its associated scan cell.

13. A boundary scan cell as defined in claim 12, each of said associated cells further including a second update latch for storing said bit value, said combination including the logic state of said second update latch.

14. A boundary scan cell as defined in claim 1, said circuit further including a comparator whose compared inputs are connected to an analog bus that is connected to pins under test and another bus, said comparator having an output connected to a circuit test data output.

15. A boundary scan cell as defined in claim 14, said circuit further including a selector for selecting between said circuit test data output and said comparator output under control of a parametric mode signal.

16. A boundary scan cell as defined in claim 1, said boundary scan cell being an IEEE 1149.1-compliant boundary scan cell associated with a digital pin.

17. An analog boundary module (ABM) containing boundary scan cells as defined in claim 1, said ABM being compliant with IEEE 1149.4.

18. An ABM as defined in claim 17, said logic circuitry of each of said boundary scan cells having an output connected to a clock input of a cell update latch and having logic gates that prevent updating of the state of said associated pin and enable updating of analog switch control signals during said parametric test mode.

19. An ABM as defined in claim 17, said logic circuitry of each of said boundary scan cells having an output connected to a clock input of an analog switch update latch and having logic gates that enable, during said parametric test mode, updating of said analog switch update latch during a test access port controller shift state.

* * * * *